United States Patent
Schubert

(10) Patent No.: US 10,056,735 B1
(45) Date of Patent: Aug. 21, 2018

(54) SCANNING UV LIGHT SOURCE UTILIZING SEMICONDUCTOR HETEROSTRUCTURES

(71) Applicant: X Development LLC, Mountain View, CA (US)

(72) Inventor: Martin F. Schubert, Mountain View, CA (US)

(73) Assignee: X Development LLC, Mountain View, CA (US)

( * ) Notice: Subject to any disclaimer, the term of this patent is extended or adjusted under 35 U.S.C. 154(b) by 0 days.

(21) Appl. No.: 15/162,389

(22) Filed: May 23, 2016

(51) Int. Cl.
*H01S 5/30* (2006.01)
*H01S 5/343* (2006.01)
(Continued)

(52) U.S. Cl.
CPC .............. *H01S 5/30* (2013.01); *B29C 64/264* (2017.08); *B29C 64/268* (2017.08); *B29C 64/277* (2017.08); *B29C 64/286* (2017.08); *B29C 64/291* (2017.08); *H01J 37/1472* (2013.01); *H01J 37/21* (2013.01); *H01S 3/0959* (2013.01); *H01S 5/042* (2013.01); *H01S 5/125* (2013.01); *H01S 5/32341* (2013.01); *H01S 5/34333* (2013.01); *B29K 2105/0002* (2013.01); *B33Y 10/00* (2014.12); *B33Y 30/00* (2014.12); *B33Y 50/02* (2014.12)

(58) Field of Classification Search
CPC ........ H01S 3/0959; H01S 5/042; H01S 5/125; H01S 5/32341; H01S 5/34333; B29C 67/0066; B29C 64/264; B29C 64/268; B29C 64/277; B29C 64/286; B29C 64/291; B29C 64/20; B22F 3/1055; B22F 3/105; B22F 2003/1056; B33Y 10/00; B33Y 30/00
See application file for complete search history.

(56) References Cited

U.S. PATENT DOCUMENTS 3,890,503 A * 6/1975 Brewster ................. H01J 3/021
378/122
4,333,165 A * 6/1982 Swainson ........... B29C 67/0051
365/119
(Continued)

FOREIGN PATENT DOCUMENTS

WO WO 2011/161775 12/2011

OTHER PUBLICATIONS

Krassenstein, Brian. "Russian Engineer Creates $250 3D Printable SLA 3D Printer Using CD/DVD-Rom Drives." 3DPrint.com | The Voice of 3D Printing / Additive Manufacturing. N.p., Oct. 13, 2014. Web. <https://3dprint.com/18601/rar-sla-3d-printer/>.*

(Continued)

*Primary Examiner* — Seyed Masoud Malekzadeh
*Assistant Examiner* — Taryn Trace Willett
(74) *Attorney, Agent, or Firm* — Christensen O'Connor Johnson Kindness PLLC

(57) ABSTRACT

Embodiments regard a scanning UV (ultra violet) light source utilizing semiconductor heterostructures. An embodiment of an apparatus includes a substrate with a film of light producing material on a first surface of the substrate, wherein the film includes one or more semiconductor heterostructures; and an electron beam apparatus, the electron beam apparatus to generate an electron beam and direct the electron beam to a location on the film of light producing material to generate a light beam.

25 Claims, 6 Drawing Sheets

(51) Int. Cl.
*H01S 5/323* (2006.01)
*H01S 5/042* (2006.01)
*H01S 3/0959* (2006.01)
*H01S 5/125* (2006.01)
*H01J 37/21* (2006.01)
*H01J 37/147* (2006.01)
*B29C 64/268* (2017.01)
*B29C 64/277* (2017.01)
*B29C 64/291* (2017.01)
*B29C 64/264* (2017.01)
*B29C 64/286* (2017.01)
*B33Y 10/00* (2015.01)
*B33Y 30/00* (2015.01)
*B33Y 50/02* (2015.01)
*B29K 105/00* (2006.01)

(56) References Cited

U.S. PATENT DOCUMENTS

| | | | | |
|---|---|---|---|---|
| 5,125,000 | A * | 6/1992 | Labrunie | H01J 1/3042 372/34 |
| 5,349,596 | A * | 9/1994 | Molva | B82Y 20/00 257/12 |
| 5,440,579 | A * | 8/1995 | Molva | H01S 5/04 372/74 |
| 5,677,923 | A | 10/1997 | Rice et al. | |
| 5,841,802 | A | 11/1998 | Whiteley et al. | |
| 6,537,052 | B1 * | 3/2003 | Adler | B29C 67/0066 264/308 |
| 6,556,602 | B2 * | 4/2003 | Rice | H01J 29/10 372/43.01 |
| 7,042,921 | B2 * | 5/2006 | Witzigmann | B82Y 20/00 372/50.11 |
| 7,496,025 | B2 * | 2/2009 | Isshiki | B82Y 20/00 369/121 |
| 7,580,440 | B2 | 8/2009 | LeBoeuf et al. | |
| 8,964,796 | B2 * | 2/2015 | Wunderer | H01S 5/3401 372/43.01 |
| 9,112,332 | B2 | 8/2015 | Wunderer et al. | |
| 9,246,311 | B1 * | 1/2016 | Raring | H01S 5/32308 |
| 2002/0145774 | A1 * | 10/2002 | Sherman | H01S 3/0959 385/16 |
| 2002/0195748 | A1 * | 12/2002 | Farnworth | B29C 67/0066 264/401 |
| 2006/0171440 | A1 * | 8/2006 | Ledentsov | G02B 5/26 372/99 |
| 2007/0036194 | A1 * | 2/2007 | Govorkov | B82Y 20/00 372/57 |
| 2008/0157412 | A1 * | 7/2008 | Kihara | B29C 67/0066 264/1.1 |
| 2009/0196314 | A1 * | 8/2009 | Duncan | H01S 5/125 372/21 |
| 2010/0074292 | A1 * | 3/2010 | Bour | B82Y 20/00 372/45.011 |
| 2013/0259077 | A1 * | 10/2013 | Ben Bakir | G02B 6/12004 372/44.01 |
| 2013/0322484 | A1 * | 12/2013 | Yamaguchi | B82Y 20/00 372/74 |
| 2014/0072009 | A1 * | 3/2014 | Wunderer | H01S 5/02461 372/45.012 |
| 2014/0369367 | A1 * | 12/2014 | Wunderer | H01S 5/3401 372/5 |
| 2015/0085891 | A1 * | 3/2015 | Watanabe | H01S 5/141 372/50.11 |
| 2016/0315449 | A1 * | 10/2016 | Shatalov | H01S 5/04 |
| 2016/0363869 | A1 * | 12/2016 | Hou | G03F 7/70416 |
| 2017/0012404 | A1 * | 1/2017 | Xing | H01S 3/1628 |
| 2017/0051884 | A1 * | 2/2017 | Raring | H01S 5/02236 |
| 2017/0117438 | A1 * | 4/2017 | Shur | H01L 33/12 |

OTHER PUBLICATIONS

"Electron Beam Pumped Lasers Based on II-VI Compound Nanostructures from the Visible to UVA", Tiberi et al., Physica Status Solidi B, vol. 247 issue 6, Jun. 2010. pp. 1547-1552.

T. Oto et al. "100 mW deep-ultraviolet emission from aluminium-nitride-based quantum wells pumped by an electron beam," Nature Photonics Vo. 4, Nov. 2010, pp. 767-770.

V.I. Kozlovsky et al. "Full Color L-CRT Projector," P.N.Lebedev Physical Institute, Academy of Sciences of Russian, Leninsky pr. 53, 117924, Moscow, Russia, SPIE vol. 2407, pp. 313-320.

* cited by examiner

SCANNING UV LIGHT SOURCE UTILIZING SEMICONDUCTOR HETEROSTRUCTURES

TECHNICAL FIELD

This disclosure relates generally to electronic devices, and in particular but not exclusively, relates a scanning UV (ultra violet) light source utilizing semiconductor heterostructures.

BACKGROUND INFORMATION

Certain processes utilize the application of scanned UV (ultraviolet) light onto a subject. Among such processes is stereolithography, also known as 3D printing and other terms, which refers to an additive manufacturing technology using photopolymerization, a process by which light causes chains of molecules to link together and form polymers.

Processes such as stereolithography are used for a growing number of purposes, including the creation of models, prototypes, patterns, and apparatus components in a layer by layer process, allowing the quick and accurate generation of objects with shapes that are difficult to produce using traditional prototyping methods.

However, a scanning operation is limited by the light source and optical system used in the relevant process. Conventional light sources include a laser or LED (light emitting diode) source that are blue/violet in color or emit in the near-UV wavelength range. Such light sources have limitations in characteristics such as available resolution, optical power, and wavelength, which thus constrain the practical throughput for the required process. Further, resolution is often limited by the optical system, such as a DLP (Digital Light Processing) with LED (Light Emitting Diode) having a certain pixel size, wherein the pixel size thus provides a particular minimum feature size.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. The drawings are not necessarily to scale, emphasis instead being placed upon illustrating the principles being described.

DETAILED DESCRIPTION

Figure 1:
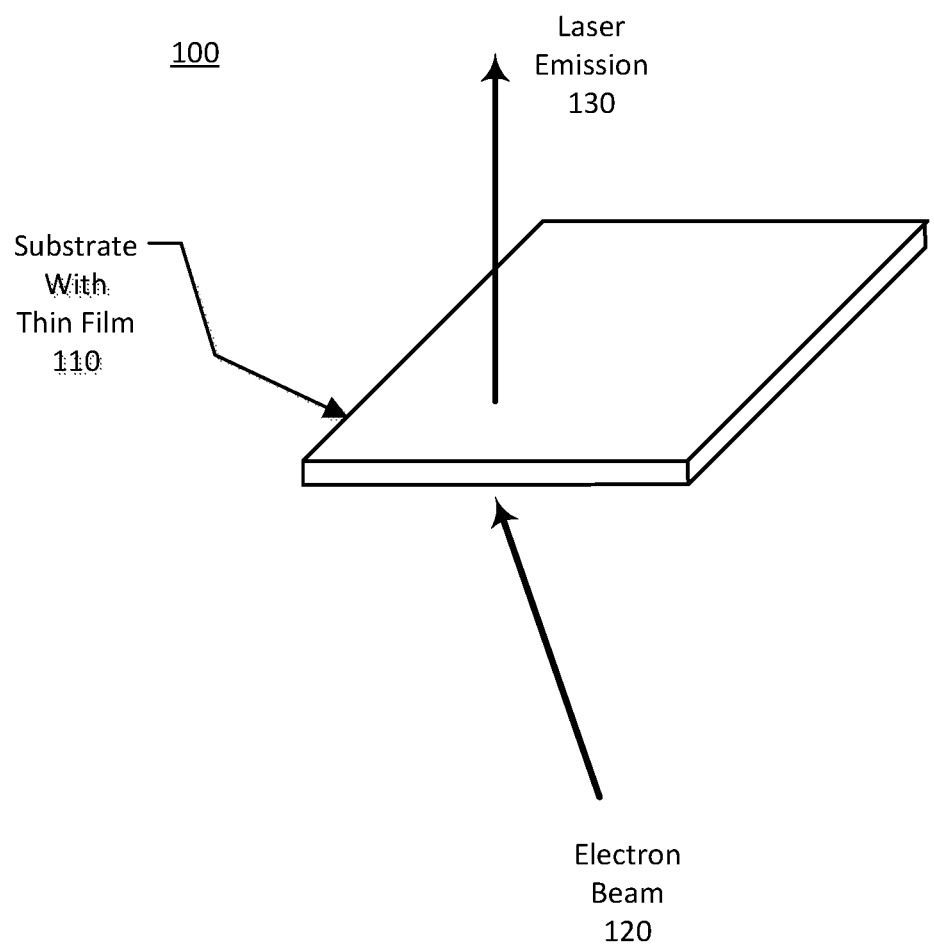
FIG. 1 is an illustration of a scanning UV light source according to an embodiment.

Embodiments of an apparatus, system, and process for a scanning UV (ultraviolet) light source utilizing semiconductor heterostructures.

In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used herein, the following definitions apply:

"Stereolithography" or "SLA", which is also known as 3D printing and other terms, refers to an additive manufacturing technology using photopolymerization, a process by which light causes chains of molecules to link together and form polymers.

Processes that utilize a scanned UV light source may include stereolithography, which is an additive manufacturing process in which a light source, which commonly is a laser or LED light source, is directed onto a tank or vat of photopolymer resin. As controlled by, for example, computer aided manufacturing (CAM) or computer aided design (CAD) software, the light source may, for example, be scanned to draw a certain pattern onto the surface of the photopolymer resin, causing the photosensitive resin to solidify and form a single layer of the desired 3D object. In addition to source scanning, other forms of 3D printing may include masked projection onto the resin, such as utilizing a DLP modulated LED system.

This scanning process is repeated for each layer of the design until the solid 3D object is complete. A system may include, for example, an apparatus in which a moveable platform descends a certain distance, and may further include a blade or other element to sweep across a cross section of the solidified layer to coat the layer with a new layer of liquid resin material. The new layer is then traced to be joined with the previous layer. Upon the tracing of the final layer of the 3D object, the platform may then raise the formed object out of the liquid resin. The formed object may then be subject to one or more processes to complete the fabrication of the 3D object, including, for example, a process for removal of excess resin, such immersion of the solid object in a chemical bath, and a curing process, such as the curing of the formed object in an ultraviolet oven.

In some embodiments, an apparatus, system, or process provides for a scanning UV light source utilizing semiconductor heterostructures, where semiconductor heterostructures may include double heterostructures, such as quantum wells, quantum wires, or quantum dots. In some embodiments, the scanning UV light source may be utilized as a laser CRT light source for a particular process. A process utilizing a scanning UV light source may include, but is not limited to, stereolithography.

Conventional light sources for process such as stereolithography 3D printing generally include lasers or LEDs which are blue/violet in color or emit in the near-UV wavelength range (for example, greater than 350 nm (nanometers), where ultraviolet light generally refers to electromagnetic radiation with a wavelength in a range between 10 nm to 380 nm). Lasers may be scanned, such as with a spinning mirror apparatus, while LEDs may be projected and modulated, such as modulation with DLP (Digital Light Processing) technology or with application of an LCD (Liquid Crystal Display) shutter (which may be referred to as LCD masking).

However, such light sources may be limited in terms of at least the following characteristics:

(1) Resolution: Resolution of light application may be limited in conventional system. In the case of LCD masking, the exposed voxels must generally lie on a predefined grid, with the smallest possible resolution being a pixel. In the case of a laser mirror, the resolution is dependent on the light beam and the stability of the spinning mirror apparatus.

(2) Physical limitations in light: Conventional systems often have significant losses in optical power because of physical limitations, thus limiting optical power throughput. For example, scanning of lasers via spinning mirrors is relatively slow and thus limits the application of optical power.

(3) Light losses in modulation: Optical modulation of a projected light source is necessarily lossy in terms the amount of light that is actually applied to a subject (as opposed to the light that is masked and thus will not be applied to a subject).

(4) Wavelength: Cost-effective and efficient electrically-driven sources are generally not available with narrow linewidth and wavelengths of 350 nanometers and shorter. Such shorter wavelengths are of interest due to, for example, the increased range of photopolymer chemistries that can be employed in stereolithography if shorter exposure wavelengths can be applied.

In some embodiments, a UV light source includes a thin film consisting of a semiconductor light-emitting material, such as AlGaN (Aluminum Gallium Nitride), having one or more semiconductor heterostructures, which may include one or more quantum wells. However, embodiments are not limited to a particular light-emitting material or semiconductor heterostructure forms. In some embodiments, different materials, such as a ZnO (Zinc Oxide) semiconductor, could be used as the light-emitting material. A double heterostructure is formed in semiconductors by a layer of low bandgap material being sandwiched between two high bandgap layers. Quantum wells are formed in semiconductors by having a sufficiently thin layer (the thin layer being comparable in thickness to the de Broglie wavelength for carriers) of a first semiconductor material between barrier layers of a material with a wider bandgap such that quantum confinement of carriers in the thin layer occurs. Thus, quantum wells can be considered as sheets of small-bandgap material surrounded by large bandgap material. Quantum wires and quantum dots are semiconductor structures that further provide lateral direction confinement, wherein a quantum wire confines carriers in two dimensions (i.e., a wire of low-bandgap material surrounded by large-bandgap material) and a quantum dot confines carriers in three dimensions (i.e., a volume of small-bandgap material comparable in size to the de Broglie wavelength for carriers in all dimensions surrounded by a large bandgap material).

In some embodiments, the quantum wells or other semiconductor heterostructures are excited with carriers by an incident electron beam generated by an electron beam apparatus, wherein the electron beam can be steered across the surface of the light emitting material or may be otherwise generated to impact the surface of the material. In some embodiments, the steering of the electron beam is performed in a manner analogous to the electron beam in a conventional CRT (cathode ray tube) display, such as utilizing one or more focusing coils to focus the electron beam and utilizing deflection coils to deflect the electron beams as required, or other similar technology. In alternative embodiments, the electron beam may remain stationary, with rasterization being performed by moving a mirror only, or with a shutter; or may be generated in an electron emitter array in which an appropriate emitter in the array is activated to generate light at the required location. Further, a spontaneous emission source (rather than a stimulated emission source, i.e. a laser) may be also be realized by the electron beam pumping approach.

Light generated within a thin film material is confined by reflective surfaces, wherein the reflective surfaces may be, for example, distributed Bragg mirrors (wherein variation in refractive index is produced by layers of materials with differing refractive indexes or by varying other characteristics to generate variation in refractive indexes), single-layer reflectors, or the AlGaN/air or AlGaN/vacuum interface itself. Due to this optical confinement and the carriers provided by electron beam pumping, a net optical gain is achieved in the quantum wells, creating a localized surface-emitting laser at the electron beam location.

In some embodiments, the AlGaN layer may be formed on a substrate including sapphire, AlN, or other material. The AlGaN layer may have an orientation that is polar, semipolar, or non-polar, wherein the orientation may be selected so that the optical gain for surface-emitting light is maximized. Further, a system may be designed with a particular thickness to provide a quantum well or other semiconductor heterostructure that generates necessary carrier density and electron efficiency for the light emitting operation.

In some embodiments, the emission of the laser CRT may be may be directly imaged onto a subject, such as a printing plane. In other embodiments, the emission from the laser CRT may first be directed onto a set of beam-steering mirrors, which may enable higher resolution to be achieved with a smaller thin film active area.

A laser CRT light source in an embodiment can be scanned extremely rapidly, can be very efficient and powerful, and can emit at wavelengths that are very difficult to reach with any reasonable efficiency with conventional electrically pumped diode emitters. Short wavelength emitters that have been demonstrated are low power and inefficient. In contrast, the higher optical power of a laser CRT light source provides the potential for higher printing throughput in 3D printing, as well as other applications. Further, the e-beam scanning of the laser CRT light source is not on a predefined grid, and thus may provide higher resolution than can be achieved with a DLP (digital light processing) or LCD shutter. The shorter wavelength may enable new and more interesting materials in stereolithography, such as photopolymers that polymerize at shorter wavelengths or chemistries that do not require photosensitizers.

Further, a UV light source according to an embodiment may provide improved resolution without the need to be limited to a predefined grid. Stated in another way, an embodiment allows for analog scanning of a UV light source.

In some embodiments, a scanning UV light source may utilize varying electron beam emitters for light production. In addition to conventional electron beam sources, a nano-scaled emitter array (including sharp nano-scaled tips acting as electron emitters) may also be utilized to produce electron beams for the generation of a UV light source.

Laser CRTs have been generated for certain implementations, such as for construction of large-area projection displays. See "Full Color Laser Cathode Ray Tube (L-CRT) Projector," V. Kozlovsky, et al., SPIE Proceedings Vol. 2407, Projection Displays 313 (Apr. 7, 1995).

Electron beam pumping of deep-UV quantum wells has been demonstrated. See "100 mW Deep-Ultraviolet Emission From Aluminium-Nitride-Based Quantum Wells Pumped by an Electron Beam," T. Oto, et al. Nature Photonics Vol. 4, 767-770 (November 2010).

FIG. 1 is an illustration of a scanning UV light source according to an embodiment. As illustrated in FIG. 1, a scanning UV light source 100 includes a substrate with a thin film of light producing material 110, wherein the thin film provides one or more semiconductor heterostructures, such as one or more quantum wells, for the production of UV light. As illustrated in FIG. 1, the thin film is located on a bottom surface of the substrate 110. In some embodiments, the thin film includes a semiconductor material, such as AlGaN (Aluminum Gallium Nitride), having one or more quantum wells.

In some embodiments, an electron beam 120 is directed to a particular location on the thin film of the substrate 110. In some embodiments, the incident electron beam 120 causes excitation of the semiconductor heterostructures with carriers. The excitation may be sufficient to create a net optical gain in the structure. In some embodiments, light generated within the film is confined by reflective surfaces (i.e., the quantum well is located between reflectors), wherein confining the light produces amplification and generates a localized surface-emitting laser at the electron beam location to produce laser emission 130.

Figure 2A:
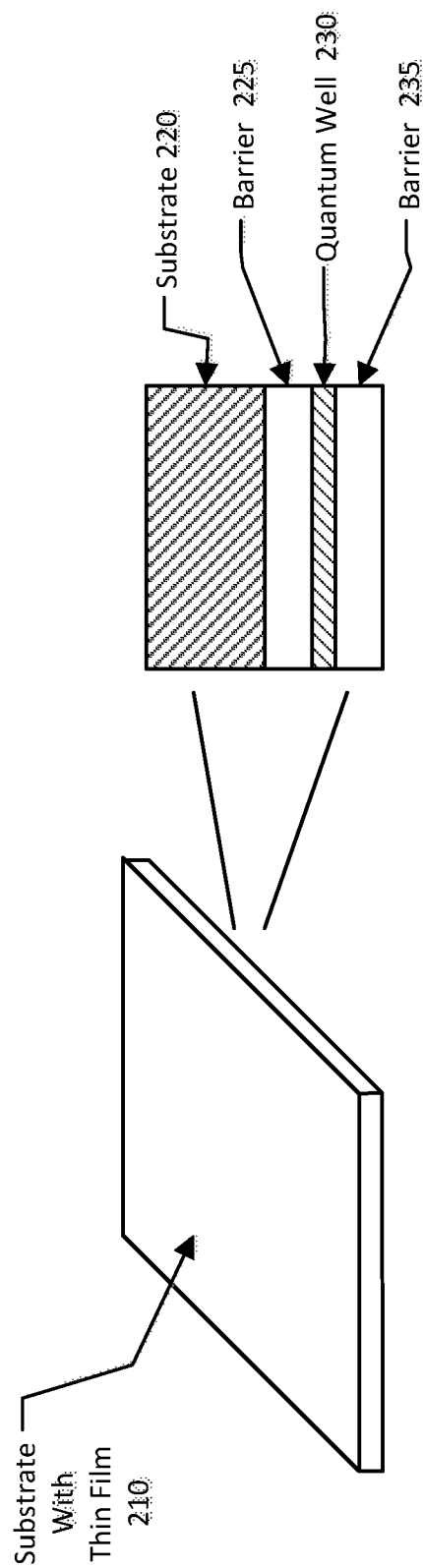
FIG. 2A is an illustration of a substrate for a scanning UV light source according to an embodiment.

FIG. 2A is an illustration of a substrate for a scanning UV light source according to an embodiment. In some embodiments, a substrate with a thin film of light producing material 210, such as substrate 110 illustrated in FIG. 1, includes a substrate 220 such as substrate including sapphire, AlN, or other material, the substrate including a top surface. In some embodiments, the thin film may be composed of an AlGaN layer or other material to form a quantum well. However, embodiments are not limited to such a quantum well structure, and may utilize, for example, other double heterostructure materials.

In the illustrated embodiment, the thin film includes a quantum well 230 between a first barrier 225 adjacent to the substrate 220 and a second barrier 235 that provides a bottom surface. The AlGaN layer may have an orientation that is polar, semi-polar, or non-polar, wherein the orientation may be selected so that the optical gain for surface-emitting light from the substrate 210 is maximized.

Figure 2B:
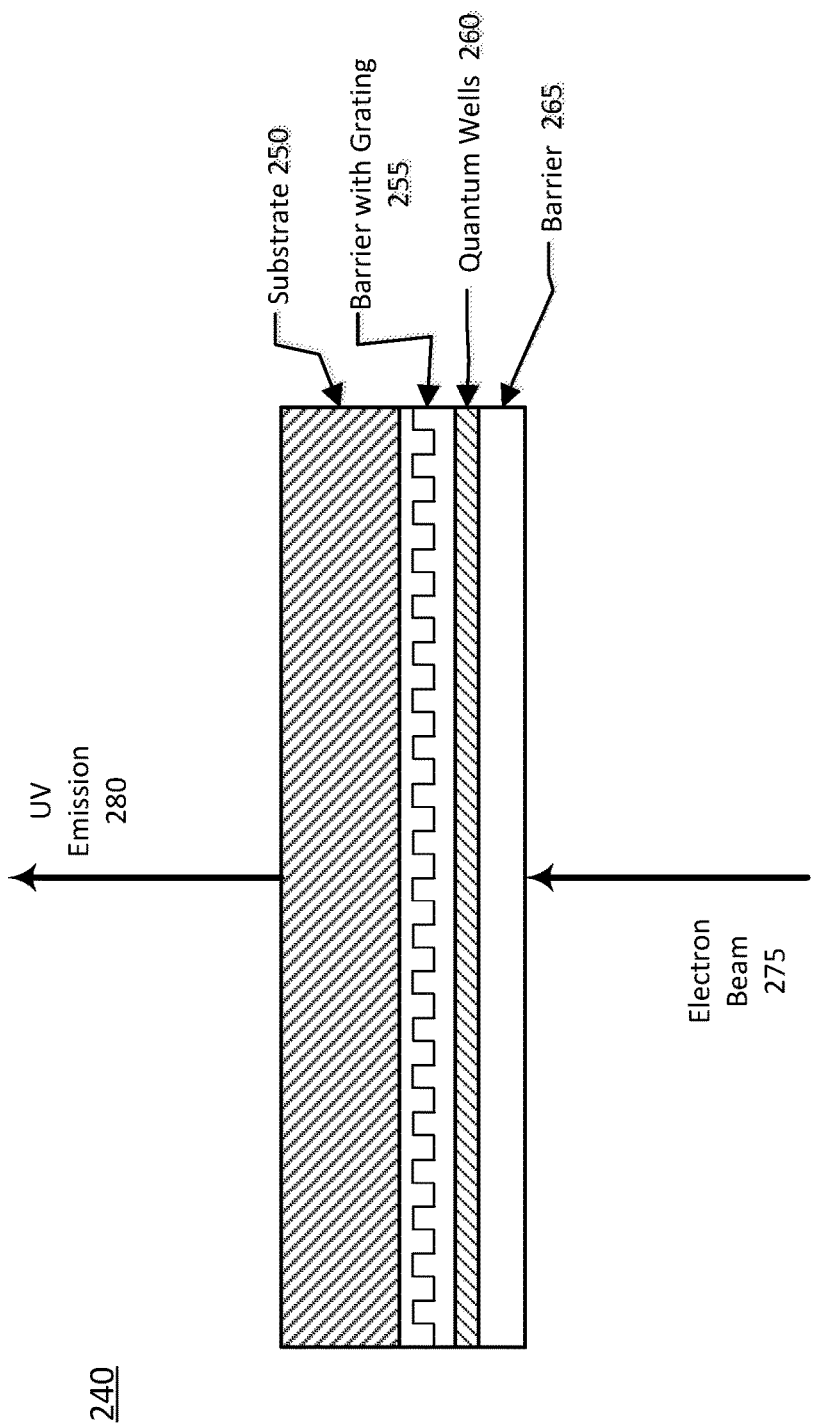
FIG. 2B is an illustration of a substrate for a scanning UV light source including a grating or photonic crystal structure according to an embodiment.

FIG. 2B is an illustration of a substrate for a scanning UV light source including a grating or photonic crystal structure according to an embodiment. In some embodiments, a substrate may further include a grating or photonic crystal structure, which, for example, couples wave-guided light into radiation modes. In some embodiments, the grating or photonic crystal structure may be implemented in lieu of one of the Bragg mirrors in a particular substrate structure. In some embodiments, a mirror is retained on the electron beam side of the substrate to yield one-sided emission.

As illustrated in FIG. 2B, a scanning UV light source 240 includes a substrate 250 with a thin film of light producing material, wherein the thin film provides one or more semiconductor heterostructures, such as one or more quantum wells 260, for the production of UV light. As illustrated in FIG. 2B, the thin film is located on a bottom surface of the substrate 250. The thin film includes quantum wells 260 between a first barrier 255 adjacent to the substrate and a second barrier 265 that provides a bottom surface. In some embodiments, the first barrier 255 includes a grating, wherein the grating provides in-plane reflection and vertical out-coupling in the generation of UV radiation. As further illustrated in FIG. 2B, an electron beam 275 is directed to a particular location on the thin film of the substrate to generate UV emission 280.

Figure 3:
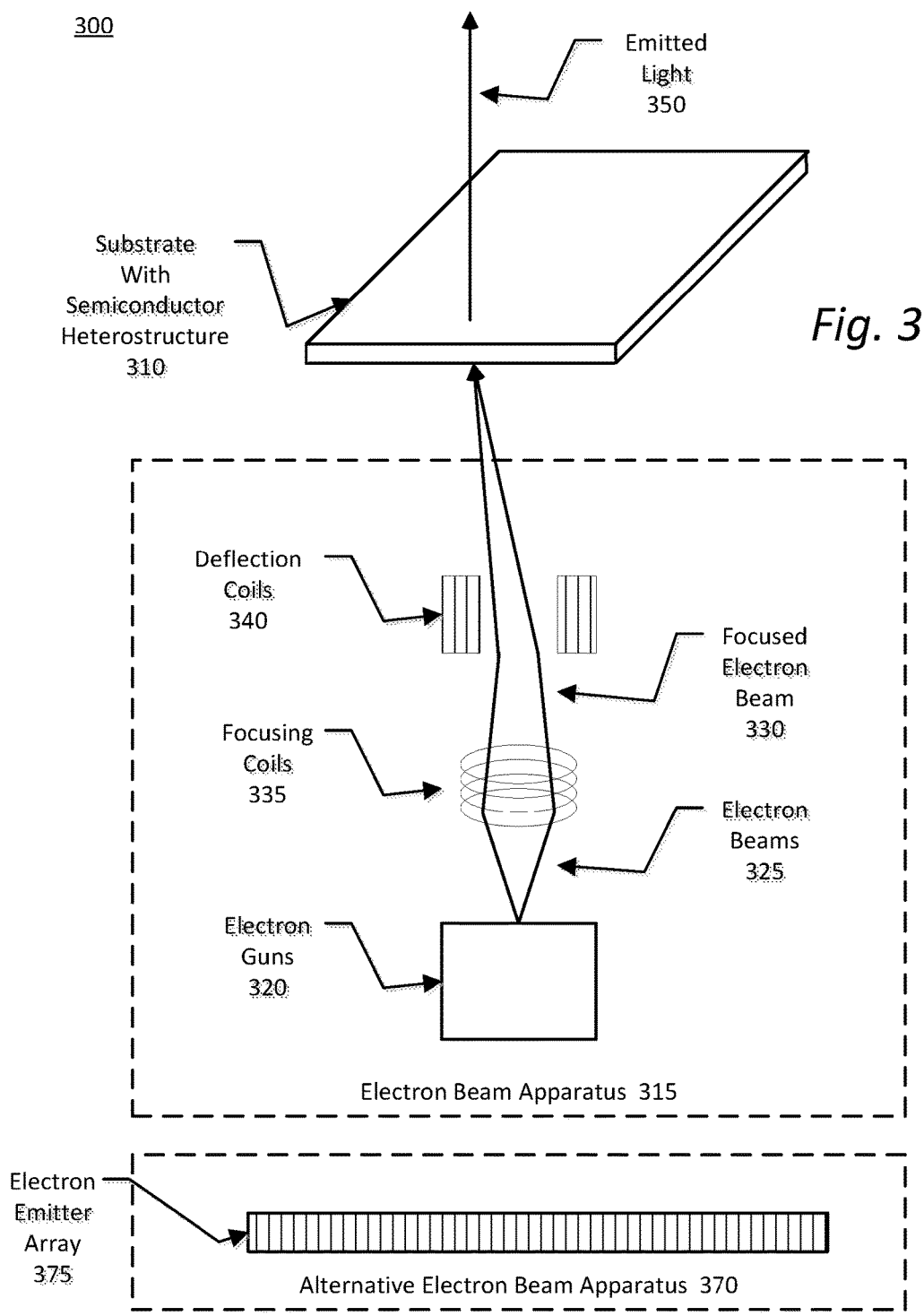
FIG. 3 is an illustration of a scanning UV light source according to an embodiment.

FIG. 3 is an illustration of a scanning UV light source according to an embodiment. In some embodiments, a scanning UV light source 300 includes a substrate with a semiconductor heterostructure 310, such as a material containing one or more quantum wells, such as the substrates 110 and 210 illustrated in FIGS. 1 and 2 respectively.

In some embodiments, the light source 300 further includes an electron beam apparatus 315 to generate and direct an electron beam. In some embodiments, the electron beam apparatus includes electron guns 320 to produce electron beams 325. In some embodiments, the electron beam apparatus 315 further includes focusing coils 335 to focus the electron beams 325, illustrated as focused electron beam 330. In some embodiments, the light source 300 further includes deflection coils 340 to deflect the focused electron beam 330 to a point on the thin film of the substrate 310 and generate emitted light 350 from the top surface of the substrate 310.

In some embodiments, the deflection of the focused electron beam 330 allows for scanning of the emitted light 350 from any point of the substrate 310. In this manner, the light source 300 provides for quick, accurate, and energy efficient scanning of light onto a subject requiring application of such light.

In some embodiments, the emitted light 350 may be may be directly imaged onto a subject, such as a printing place. In other embodiments, the emitted light 350 may first be directed onto a set of beam-steering mirrors (which are not illustrated in FIG. 3), allowing operation with a smaller thin film active area.

In operations utilizing application of UV light, there is a need to accurately and rapidly control direction of the light. A conventional system utilizes mechanical motion, which is limited in speed, accuracy, and reliability. For example, an apparatus or system may utilizes light beam steering with a mirror, requiring mechanical movement, or otherwise controlling or masking a light source. In contrast, the light source 300 utilizes the production and direction of an electron beam for the control of the production of UV light, thus eliminating the mechanical operation of a conventional system to enable and scan UV light, and improving the operation and efficiency of the light operation.

However, embodiments are not limited to the particular electron beam apparatus 315 illustrated in FIG. 3. In some embodiments, an alternative electron beam apparatus 370 may include, for example, an electron emitter array 375 in which an appropriate emitter in the array is activated to generate light at the required location to impact the substrate 310.

Figure 4:
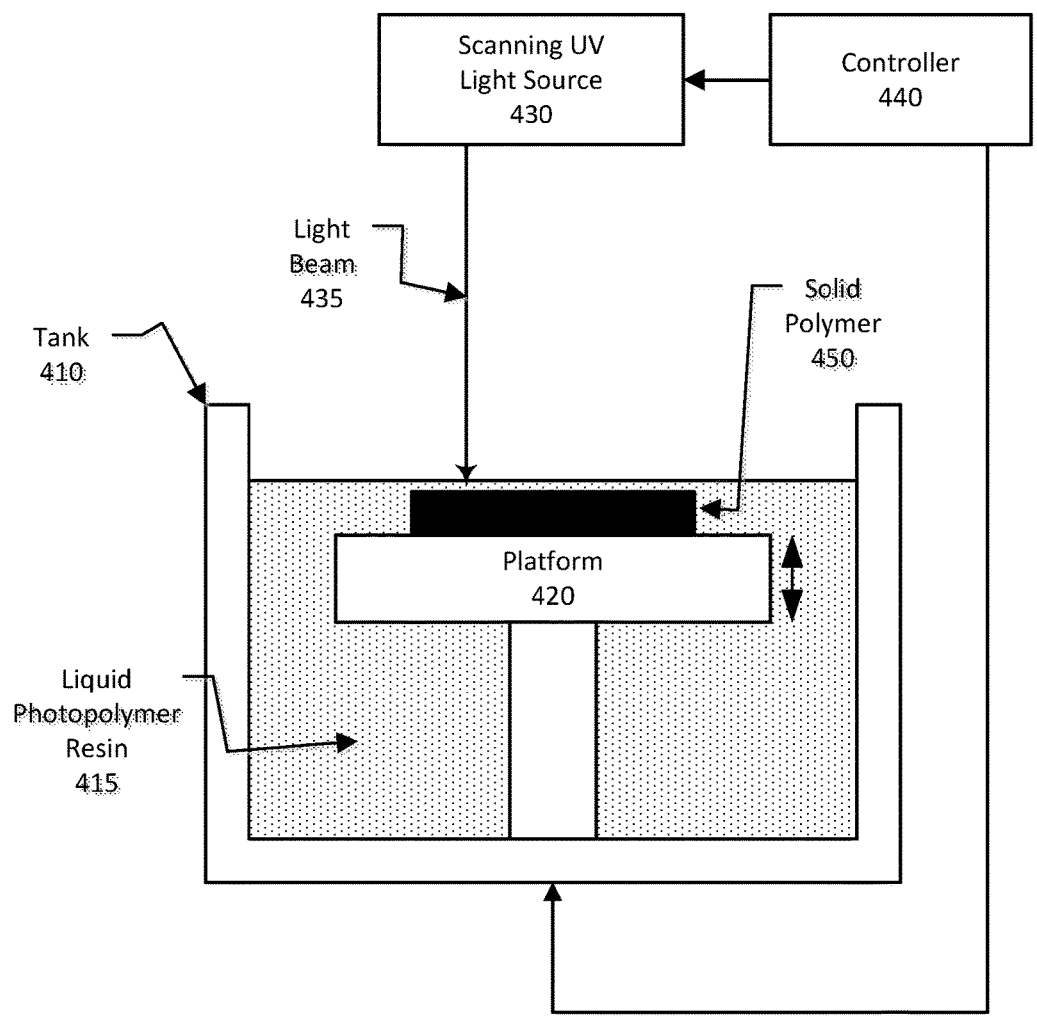
FIG. 4 is an illustration of a stereolithography system including a scanning UV light source according to an embodiment.

FIG. 4 is an illustration of a stereolithography system including a scanning UV light source according to an embodiment. In some embodiments, the stereolithography system 400 includes, but is not limited to, the following:

(1) A tank or vat 410 to contain a liquid photopolymer resin 415, with the resin being photosensitive, producing a solid polymer by the process of photopolymerization when a light of an appropriate wavelength is directed onto such resin.

(2) A moveable platform (or elevator) 420 that may descend in a controlled manner into the tank 410 as layers of resin are solidified to enable light to be incident on a thin layer of liquid resin as an object of a solid polymer material 450 is produced layer by layer. The moveable platform 420 may further reverse to raise the solid polymer object 450 after the final layer of the object is completed. The platform 420 includes or is coupled with a motor or other driving force to move the platform up and down as required.

(3) A scanning UV light source 430, such as the scanning UV light source 300 illustrated in FIG. 3. In some embodiments, the light source 430 includes a substrate with a thin film of light producing material containing a quantum well or other double heterostructure, which may include the substrate 110 and 210 illustrated in FIGS. 1 and 2 respectively. In some embodiments, the light source 430 produces a light beam 435 at any point at which an electron beam provides excitation of carriers, resulting in a surface light source at the point. In some embodiments, the light source 430 is operable to scan across the surface of the liquid photopolymer resin 415 to produce the solid polymer object 450 in a layer by layer process.

(4) A controller 440, which may include a computing system, to control one or more of the movement of the platform 420 and the movement and operation of the light source 430. In some embodiments, the controller 440 controls the generation of the light beam 435 from the light source 430, such as by the control of the direction of an electron beam to a particular location on a film containing a quantum well or other double heterostructure. In some embodiments, the control of the direction of an electron beam includes control of deflection coils, such as the deflection coils 340, or the activation of an appropriate emitter in an electron emitter array 375, as illustrated in FIG. 3.

Figure 5:
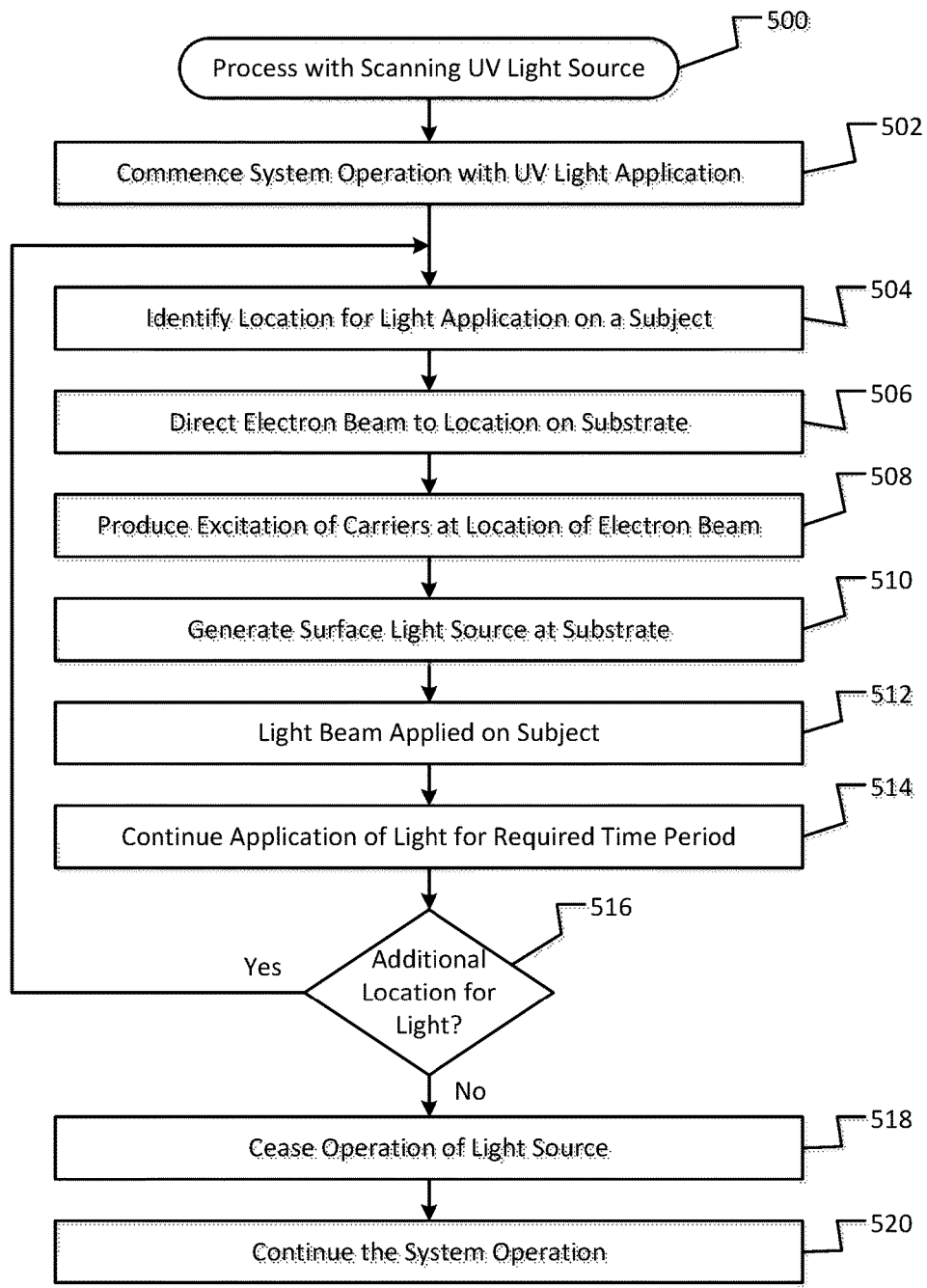
FIG. 5 is an illustration of a process including application of a scanning UV light source according to an embodiment.

FIG. 5 is an illustration of a process including application of a scanning UV light source according to an embodiment.

In some embodiments, a process 500 includes:

502: Commencing a system operation utilizing UV light application. The operation may include, but is not limited to, stereolithography operation utilizing a scanning UV light source for the photopolymerization.

504: Identification of a location for light application on a subject. In a particular implementation, the subject may include a layer of liquid resin in a stereolithography operation, and the location is portion of a layer to be subjected to UV light to generation a next layer of an object to be produced by the stereolithography operation, such as illustrated in FIG. 4. However, embodiments are not limited to this particular implementation.

506: Directing an electron beam to a location on a substrate including a semiconductor heterostructure, such as a thin film including a quantum well or other double heterostructure.

508: Producing excitation of carriers as a result of the application of the electron beam.

510: Generation of surface light source at the location of the incident electron beam.

512: Application of the generated light beam onto the subject of the UV light.

514: Continue application of the generated light beam for a required time period for the required operation, such as, for example, providing sufficient light application for photopolymerization in a stereolithography operation.

516: If there is an additional location for the application of the generated light, such as additional area in the current layer in a stereolithography operation, the process may return to with identifying the following location from light application on the subject 504.

518: If not, such as, for example, if the current layer in a stereolithography operation is complete, then ceasing operation of the light source, at least temporarily.

520: Continuing the system operation, which may include, for example, moving a platform in a stereolithography operation to a lower level for processing of a next layer for the generation of the solid object.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit (ASIC) or otherwise.

A tangible machine-readable storage medium includes any mechanism that provides (i.e., stores) information in a non-transitory form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An apparatus comprising:
    a substrate with a film of light producing material on a first surface of the substrate, wherein the film of light producing material includes one or more semiconductor heterostructures; and
    an electron beam apparatus, the electron beam apparatus coupled to generate an electron beam and steer the electron beam to a plurality of locations on the film of light producing material to generate a light beam, including ultraviolet light, where the electron beam is incident on the film of light producing material, wherein the film of light producing material is structured to facilitate analog scanning of the beam of light, not on a predefined grid, where the electron beam is incident on the film of light producing material.

2. The apparatus of claim 1, wherein the one or more semiconductor heterostructures include one or more double heterostructures.

3. The apparatus of claim 1, wherein the one or more semiconductor heterostructures include one or more quantum wells.

4. The apparatus of claim 3, wherein the one or more semiconductor heterostructures includes a first barrier layer and a second barrier layer, and wherein the one or more quantum wells are disposed between the first barrier layer and the second barrier layer, and the first barrier layer and a second barrier layer have a wider bandgap than the one or more quantum wells.

5. The apparatus of claim 4, further comprising a grating disposed in the first barrier layer to provide in-plane reflection and vertical out-coupling in the generation of the light beam.

6. The apparatus of claim 1, wherein the one or more semiconductor heterostructures includes one or more of a quantum wire or quantum dot.

7. The apparatus of claim 1, wherein the light producing material includes AlGaN (Aluminum Gallium Nitride).

8. The apparatus of claim 1, wherein the film is located between reflective surfaces.

9. The apparatus of claim 8, wherein the reflective surfaces include a distributed Bragg mirror.

10. The apparatus of claim 8, wherein the reflective surfaces include the interface of the film with air or a vacuum.

11. The apparatus of claim 1, wherein substrate includes one of sapphire or AlN (Aluminum Nitride) material.

12. The apparatus of claim 1, wherein the generated light beam is a laser light beam.

13. The apparatus of claim 1, wherein the electron beam apparatus includes electron guns to generate electron beams.

14. The apparatus of claim 13, wherein the electron beam apparatus further includes focusing coils to focus the generated electron beams into a focused electron beam.

15. The apparatus of claim 14, wherein the electron beam apparatus further includes deflection coils to deflect the focused electron beam and steer the electron beam to the plurality of locations.

16. The apparatus of claim 1, wherein the electron beam apparatus includes an electron emitter array to generate an electron beam by activating an appropriate emitter in the emitter array.

17. A stereolithography system including:
a tank to contain a liquid photopolymer resin;
a moveable platform to hold a solid object generated by photopolymerization of the resin;
a UV (ultraviolet) light source including:
  a substrate with a film of light producing material on a first surface of the substrate, wherein the film of light producing material includes one or more semiconductor heterostructures, and
  an electron beam apparatus, the electron beam apparatus coupled to generate an electron beam and direct the electron beam to a plurality of locations on the film of light producing material to generate a light beam where the electron beam is incident on the film of light producing material, wherein the film of light producing material is structured to facilitate analog scanning of the beam of light, not on a predefined grid, where the electron beam is incident on the film of light producing material; and
a controller to provide control for one or more of the UV light source and the platform.

18. The system of claim 17, wherein the one or more semiconductor heterostructures include one or more double heterostructures.

19. The system of claim 17, wherein the one or more semiconductor heterostructures include one or more of a quantum well, a quantum wire, or a quantum dot.

20. The system of claim 17, wherein the light source is to direct the generated light beam on a layer of the resin to generate a layer of the solid object.

21. The system of claim 17, wherein the light producing material includes AlGaN (Aluminum Gallium Nitride).

22. The system of claim 17, wherein the film is located between reflective surfaces.

23. The system of claim 17, wherein substrate includes one of sapphire or AlN (Aluminum Nitride) material.

24. The system of claim 17, wherein the generated light beam is a laser light beam.

25. The apparatus of claim 1, wherein the electron beam apparatus is coupled to rasterize the electron beam across the film of light producing material.

* * * * *